(12) United States Patent
Kimura et al.

(10) Patent No.: US 8,040,208 B2
(45) Date of Patent: Oct. 18, 2011

(54) MODULE AND PASSIVE PART

(75) Inventors: Hironobu Kimura, Saku (JP); Yasuhiko Mizutani, Komaki (JP); Masaki Urano, Saku (JP); Takenori Kasai, Saku (JP)

(73) Assignee: Soshin Electric Co., Ltd., Saku (JP)

( * ) Notice: Subject to any disclaimer, the term of this patent is extended or adjusted under 35 U.S.C. 154(b) by 588 days.

(21) Appl. No.: 12/278,292

(22) PCT Filed: Feb. 28, 2007

(86) PCT No.: PCT/JP2007/053771
§ 371 (c)(1),
(2), (4) Date: Aug. 5, 2008

(87) PCT Pub. No.: WO2007/100003
PCT Pub. Date: Sep. 7, 2007

(65) Prior Publication Data
US 2009/0051460 A1 Feb. 26, 2009

(30) Foreign Application Priority Data
Feb. 28, 2006 (JP) .................................. 2006-053501

(51) Int. Cl.
*H01P 1/203* (2006.01)
*H01P 5/10* (2006.01)

(52) U.S. Cl. ............................ 333/204; 333/32; 333/26

(58) Field of Classification Search ............. 333/32, 333/33, 35, 166–168, 174–176, 185, 202–205
See application file for complete search history.

(56) References Cited

U.S. PATENT DOCUMENTS

| 4,992,759 A | 2/1991 | Girandeau et al. |
| 2003/0020568 A1 | 1/2003 | Mizutani et al. |
| 2003/0025571 A1 | 2/2003 | Maekawa et al. |
| 2003/0141948 A1 | 7/2003 | Maekawa et al. |

FOREIGN PATENT DOCUMENTS

| JP | 62-030401 A1 | 2/1987 |
| JP | 63-258101 A1 | 10/1988 |
| JP | 04-284703 A1 | 10/1992 |
| JP | 09-135140 A1 | 5/1997 |
| JP | 2002-280805 A1 | 9/2002 |
| JP | 2003-087008 A1 | 3/2003 |
| JP | 2004-056745 A1 | 2/2004 |
| JP | 2005-159512 A1 | 6/2005 |

OTHER PUBLICATIONS

Katsuo Koizumi, "Design Technique for High-Frequency Band Filter," Transistor Gijutsu, Feb. 1, 1988, pp. 403-412.

*Primary Examiner* — Benny Lee
*Assistant Examiner* — Gerald Stevens
(74) *Attorney, Agent, or Firm* — Burr & Brown

(57) ABSTRACT

A passive part includes a filter unit having first resonance electrode to a third resonance electrode and an impedance matching circuit unit electrically connected to the third resonance electrode of the filter unit arranged on a dielectric substrate. The entire passive part has a configuration including a circuit unit equivalent to characteristic containing the second impedance matching circuit by an impedance component of the third resonance electrode. For example, by modifying the width of the third resonance electrode, it is possible to adjust the impedance in the same way as when a capacitance as the impedance matching circuit unit is connected, without connecting any capacitance.

2 Claims, 18 Drawing Sheets

MODULE AND PASSIVE PART

FIELD OF THE INVENTION

The present invention relates to a module comprising a filter having a plurality of resonators and an external circuit connected to the filter and including an impedance matching circuit, which comprises a circuit element (coil or the like). The present invention also is concerned with a passive part, comprising a filter having a plurality of resonator electrodes and an impedance matching circuit, which comprises a circuit element (electrode or the like), the filter and the impedance matching circuit being disposed in a dielectric substrate.

BACKGROUND ART OF THE INVENTION

Recently, semiconductor components such as ICs have been highly integrated and have quickly become smaller in size. High-frequency components such as filters for use with semiconductor devices have also become smaller in size. Dielectric substrates made up of a plurality of dielectric layers are effective in making high-frequency components smaller in size (see, for example, Patent Documents 1 and 2).

Generally, it has been proposed to integrally combine a filter and an unbalanced-to-balanced converter in a dielectric substrate (see, for example, Patent Document 3).

Patent Document 1: Japanese Laid-Open Patent Publication No. 2002-280805

Patent Document 2: Japanese Laid-Open Patent Publication No. 2005-159512

Patent Document 3: Japanese Laid-Open Patent Publication No. 2004-056745

DISCLOSURE SUMMARY OF THE INVENTION

High-frequency components of the background art are designed such that they have one unbalanced input terminal and one unbalanced output terminal, and have a characteristic impedance matched to 50 ohms.

Some external circuits such as semiconductor components to be connected to the unbalanced output terminal of a high-frequency component have an input resistance including not only a real part (resistive component) of 50 ohms but also an imaginary part (reactive component). Therefore, it is necessary to insert and connect an external impedance circuit made up of a coil, a capacitor, or the like, for example, between the unbalanced output terminal of the high-frequency component and an external circuit. As a result, an overall module, including the high-frequency component and the external circuit, occupies a large mounting area. The impedance matching circuit often is constructed of a mixture of many parts, thus making the circuit adaptable to various impedance matching applications.

Therefore, when high-frequency components of the background art are connected to external circuits or the like to provide modules, there are limitations imposed on efforts to reduce the size and cost of such modules.

The present invention has been made in view of the above drawbacks. It is an object of the present invention to provide a module, which is made up of a reduced number of parts, is small in size, and has a reduced mounting area.

Another object of the present invention is to provide a passive part, which allows electrodes or the like disposed in a dielectric substrate to be reduced in number and size, and which, when connected to a semiconductor component or the like to provide a module, enables the module to be reduced in size and cost.

A module according to the present invention comprises a filter including at least a first resonator electrically connected to a first terminal and a second resonator electrically connected to a second terminal, wherein the filter includes a circuit corresponding to characteristics including an impedance matching circuit due to an impedance component of the second resonator.

The circuit corresponding to characteristics including the impedance matching circuit due to an impedance component of the second resonator implies that the impedance of the overall module, as seen from the second terminal, is equivalent to one including the circuit corresponding to characteristics including the impedance matching circuit.

With this arrangement, the impedance matching circuit may not be connected to the filter. Even if another impedance matching circuit is connected to the filter, since the impedance component of the second resonator of the filter turns the overall module into a configuration including the circuit corresponding to characteristics including the impedance matching circuit, a circuit element that provides the other impedance matching circuit may be omitted. According to the present invention, therefore, the module is made up of a reduced number of parts, is small in size, and occupies a reduced mounting area.

Another module according to the present invention comprises a filter including at least a first resonator electrically connected to a first terminal and a second resonator electrically connected to a second terminal, and a first impedance matching circuit electrically connected to the second terminal of the filter, wherein the module includes a circuit corresponding to characteristics including a second impedance matching circuit, in addition to the first impedance matching circuit, due to an impedance component of the second resonator.

Since the impedance component of the second resonator turns the overall module into a configuration including the circuit corresponding to characteristics including the second impedance matching circuit, in addition to the first impedance matching circuit, a circuit element that provides the first impedance matching circuit connected to the filter may be omitted. Therefore, the module is made up of a reduced number of parts, is small in size, and occupies a reduced mounting area.

Still another module according to the present invention comprises a filter including at least a first resonator electrically connected to a first terminal and a second resonator electrically connected to a second terminal, and a circuit element electrically connected to the second terminal of the filter, wherein the circuit element has an impedance adjusted by an impedance component of the second resonator.

Inasmuch as the impedance of the circuit element is adjusted by the impedance component of the second resonator, an impedance matching circuit does not need to be inserted and connected between the circuit element and an external circuit, and hence the overall module is made up of a reduced number of parts, is small in size, and occupies a reduced mounting area.

A passive part according to the present invention comprises a filter having at least a first resonator electrode and a second resonator electrode disposed in a dielectric substrate, wherein the dielectric substrate includes a circuit corresponding to characteristics including an impedance matching circuit due to an impedance component of the second resonator electrode.

With this arrangement, the impedance matching circuit may not be connected to the filter. Even if another impedance matching circuit is connected to the filter, since the impedance component of the second resonator of the filter turns the overall passive part into a configuration including the circuit corresponding to characteristics including the impedance matching circuit, a circuit element that provides the other impedance matching circuit may be omitted. Therefore, a module incorporating the passive part according to the present invention is made up of a reduced number of parts, is small in size, and occupies a reduced mounting area. Even if another impedance matching circuit is disposed, in addition to the filter, in the dielectric substrate, since the impedance component of the second resonator electrode of the filter turns the overall passive part into a configuration having characteristics including a second impedance matching circuit, in addition to the other impedance matching circuit, a circuit (e.g., an electrode) that provides the other impedance matching circuit may be omitted. Therefore, the passive part according to the present invention makes it possible for the number of electrodes, for example, disposed in the dielectric substrate to be reduced, and thus the passive part itself is reduced in size.

Another passive part according to the present invention comprises a filter having at least a first resonator electrode and a second resonator electrode disposed in a dielectric substrate, and a first impedance matching circuit electrically connected to the second resonator electrode of the filter, wherein the dielectric substrate includes a circuit corresponding to characteristics including a second impedance matching circuit due to an impedance component of the second resonator electrode.

Since the impedance component of the second resonator electrode turns the overall passive part into a configuration including a circuit corresponding to characteristics including the second impedance matching circuit, in addition to the first impedance matching circuit, a circuit (e.g., an electrode) that provides the first impedance matching circuit disposed in the dielectric substrate may be omitted. Therefore, the number of electrodes, for example, disposed in the dielectric substrate is reduced, and thus the passive part itself is reduced in size.

In the above arrangement, if the second resonator electrode is connected electrically to the first impedance matching circuit by a tap electrode, then the impedance component of the second resonator electrode may include a resistive component adjusted by a position in which the second resonator electrode and the tap electrode are connected to each other.

Still another passive part according to the present invention comprises a filter having at least a first resonator electrode and a second resonator electrode disposed in a dielectric substrate, and a circuit element having one or more electrodes, the second resonator electrode of the filter and the circuit element being electrically connected to each other, wherein the circuit element has an impedance adjusted by an impedance component of the second resonator electrode.

Since the impedance of the circuit element disposed in the dielectric substrate is adjusted by the impedance component of the second resonator electrode, which also is disposed in the dielectric substrate, it is not necessary to provide an electrode or the like for adjusting the impedance of the circuit element in the dielectric substrate, and no impedance matching circuit needs to be inserted and connected between the circuit element and an external circuit. Accordingly, the overall passive part is reduced in size. Further, a module incorporating the passive part can be made up of a reduced number of parts and be smaller in size as a whole.

In the above arrangement, if the second resonator electrode is connected electrically to the circuit element by a tap electrode, the impedance component of the second resonator electrode may include a resistive component adjusted by a position in which the second resonator electrode and the tap electrode are connected to each other.

In the above arrangement, the impedance component of the second resonator electrode may include a susceptive component adjusted by a width of the second resonator electrode.

As described above, the module according to the present invention is made up of a reduced number of parts, is small in size, and occupies a reduced mounting area.

The passive part according to the present invention enables electrodes or the like disposed in the dielectric substrate to be reduced in number and size. Also, when connected to a semiconductor component or the like to provide a module, the passive part enables the module to be reduced in size and cost.

BEST MODE FOR CARRYING OUT DETAILED DESCRIPTION OF THE INVENTION

Modules and passive parts according to embodiments of the present invention will be described below with reference to FIGS. 1 through 18.

Prior to presenting a description of a module 10A according to the first embodiment, the circuit arrangement of a module (a module 100A according to a first comparative example), which is fabricated before the module 10A according to the first embodiment is completed, will be described below.

Figure 1:
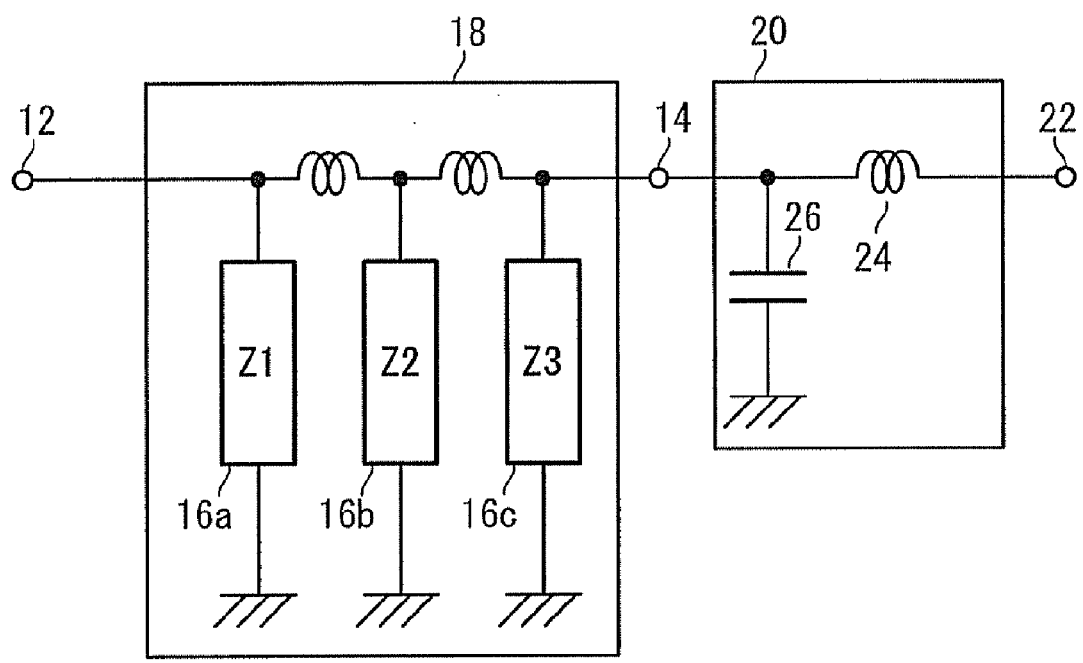
FIG. 1 is a circuit diagram of a module according to a first comparative example of the present invention.

As shown in FIG. 1, the module 100A according to the first comparative example comprises a filter 18 having an input terminal 12, an output terminal 14, and first through third resonators 16a through 16c connected between the input terminal 12 and the output terminal 14. The module 100A also has an impedance matching circuit 20 electrically connected to the output terminal 14 of the filter 18. The impedance matching circuit 20 has an external terminal 22 connected to an external circuit, not shown.

The impedance matching circuit 20 comprises, for example, a coil 24 connected between the output terminal 14 of the filter 18 and the external terminal 22, and a capacitor 26 connected between the output terminal 14 and GND (ground).

In the module 100A according to the first comparative example, the output impedance of the module 100A and the input impedance of the external circuit are adjusted to a given value (e.g., 50 ohms) by a reactive component of the coil 24 and a susceptive component of the capacitor 26 of the impedance matching circuit 20.

Figure 2:
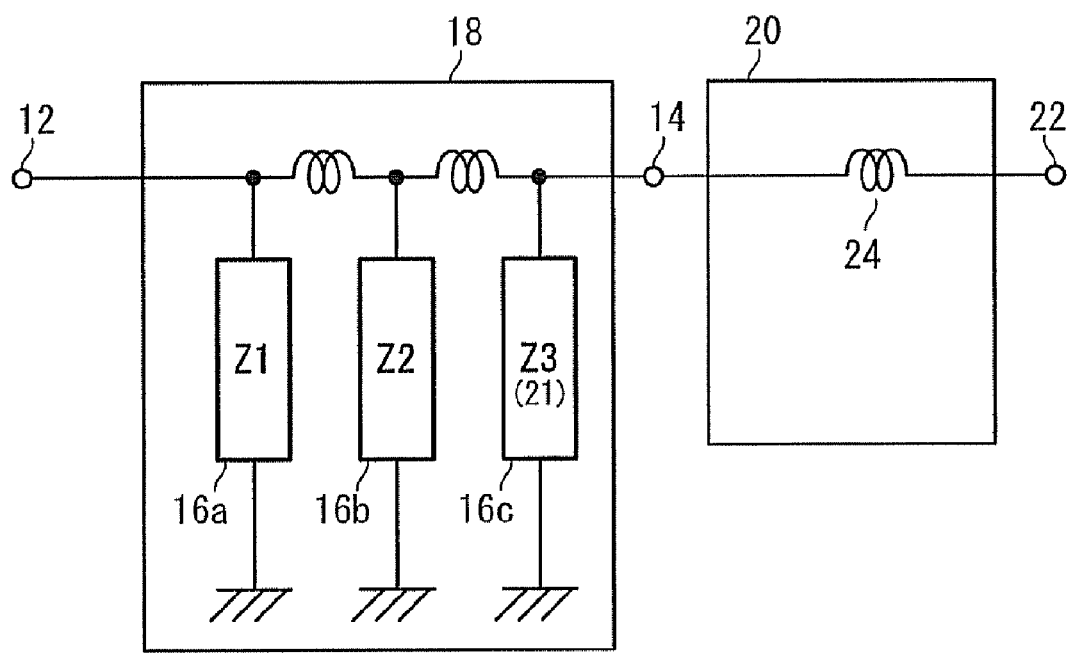
FIG. 2 is a circuit diagram of a module according to a first embodiment of the present invention.

As shown in FIG. 2, the module 10A according to the first embodiment has substantially the same configuration as that of the above module 100A according to the first comparative example. However, among the three resonators (the first resonator 16a, the second resonator 16b, and the third resonator 16c) of the filter 18, the third resonator 16c, which is connected to the output terminal 14, has an impedance component Z3 that forms a circuit corresponding to characteristics including a second impedance matching circuit 21. In FIG. 2, the impedance component Z3 of the third resonator 16c turns the overall module 10A into a configuration including a circuit corresponding to characteristics that include a circuit (the second impedance matching circuit 21) corresponding to the capacitor 26 of the impedance matching circuit 20 shown in FIG. 1.

In other words, the impedance component Z3 of the third resonator 16c is adjusted (varied) in order to make the impedance, as seen from the output terminal 14, equivalent to one including a circuit corresponding to characteristics that include the second impedance matching circuit 21.

Figure 3:
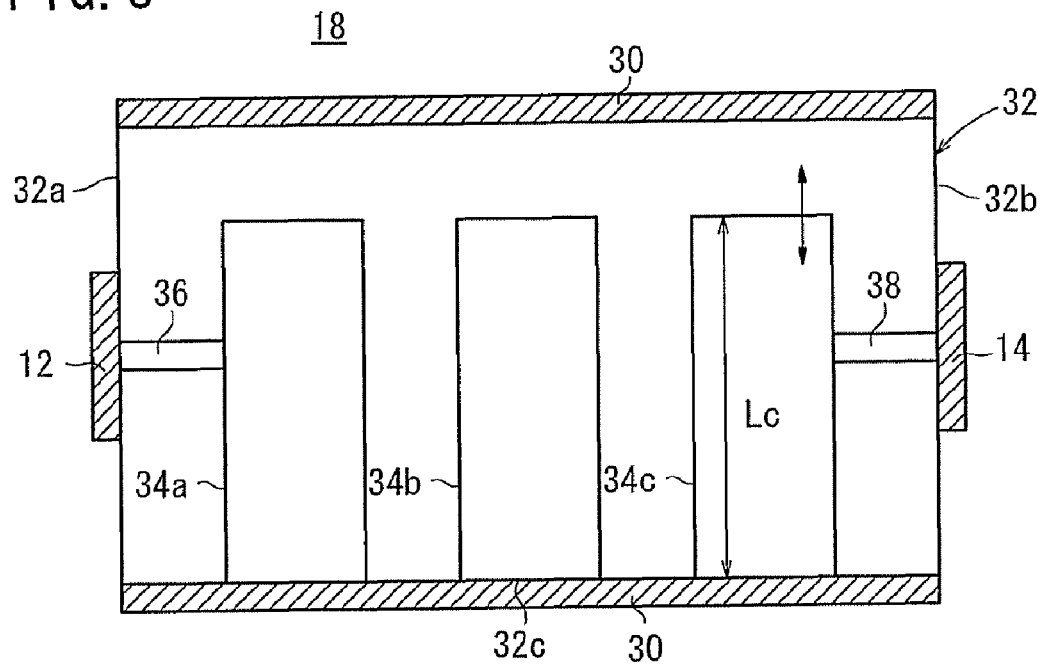
FIG. 3 is a horizontal cross-sectional view of resonator electrodes of a filter of the module according to the first embodiment.
Figure 4:
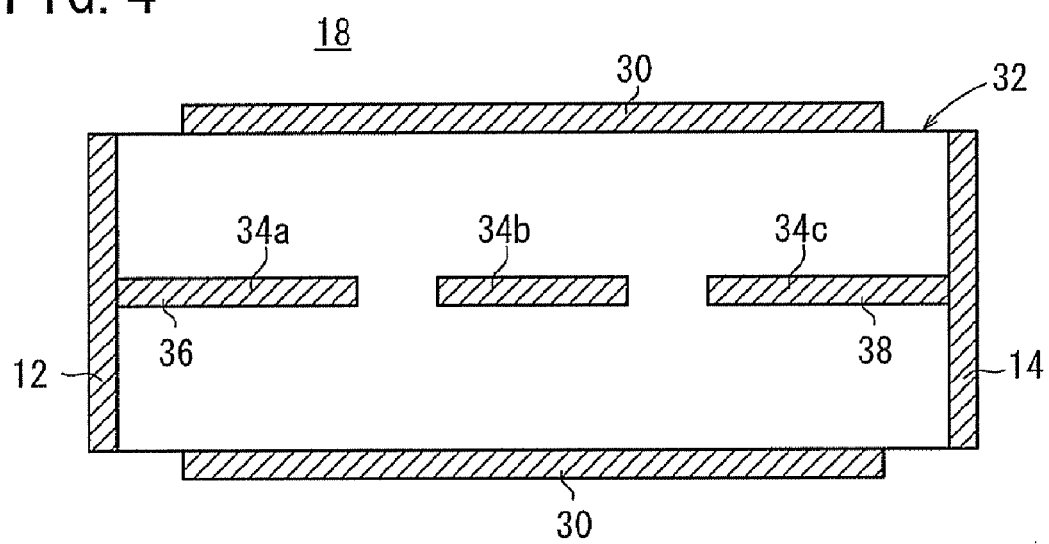
FIG. 4 is a vertical cross-sectional view of the resonator electrodes of the filter of the module according to the first embodiment.

As shown in FIGS. 3 and 4, the filter 18 comprises a dielectric substrate 32 having ground electrodes 30 (see FIG. 4) on upper and lower surfaces thereof, and three electrodes (a first resonator electrode 34a, a second resonator electrode 34b, and a third resonator electrode 34c) disposed in the dielectric substrate 32.

The input terminal 12 is disposed on a first side surface 32a of the dielectric substrate 32, and the output terminal 14 is disposed on a second side surface 32b of the dielectric substrate 32. The first resonator electrode 34a is connected electrically to the input terminal 12 by a first lead electrode 36, whereas the third resonator electrode 34c is connected electrically to the output terminal 14 by a second lead electrode 38. The first through third resonator electrodes 34a through 34c have respective short-circuiting ends connected to the ground electrode 30 on a third side surface 32c of the dielectric substrate 32.

According to the first embodiment, as shown in FIG. 3, among the three resonator electrodes 34a through 34c, the third resonator electrode 34c, which is connected to the output terminal 14, has a line length Lc suitably varied to make it possible to adjust the impedance in the same manner as if the capacitor 26 (see FIG. 1) were connected thereto, although the capacitor 26 is not actually connected to the impedance matching circuit 20 as shown in FIG. 2. In other words, the impedance component Z3 of the third resonator 16c turns the overall module 10A into a configuration including a circuit corresponding to characteristics that include a circuit (the second impedance matching circuit 21) corresponding to the capacitor 26 of the impedance matching circuit 20 shown in FIG. 1. In FIG. 3, the first through third resonator electrodes 34a through 34c have the same width, and the first resonator electrode 34a and the second resonator electrode 34b have the same line length.

With the module 10A according to the first embodiment, since the impedance component Z3 of the third resonator 16c turns the overall module 10A into a configuration including a circuit corresponding to characteristics that include the second impedance matching circuit 21, a circuit element (the capacitor 26) of the impedance matching circuit 20 can be omitted, and hence the module 10A is made up of a reduced number of parts, is small in size, and occupies a reduced mounting area.

Figure 5:
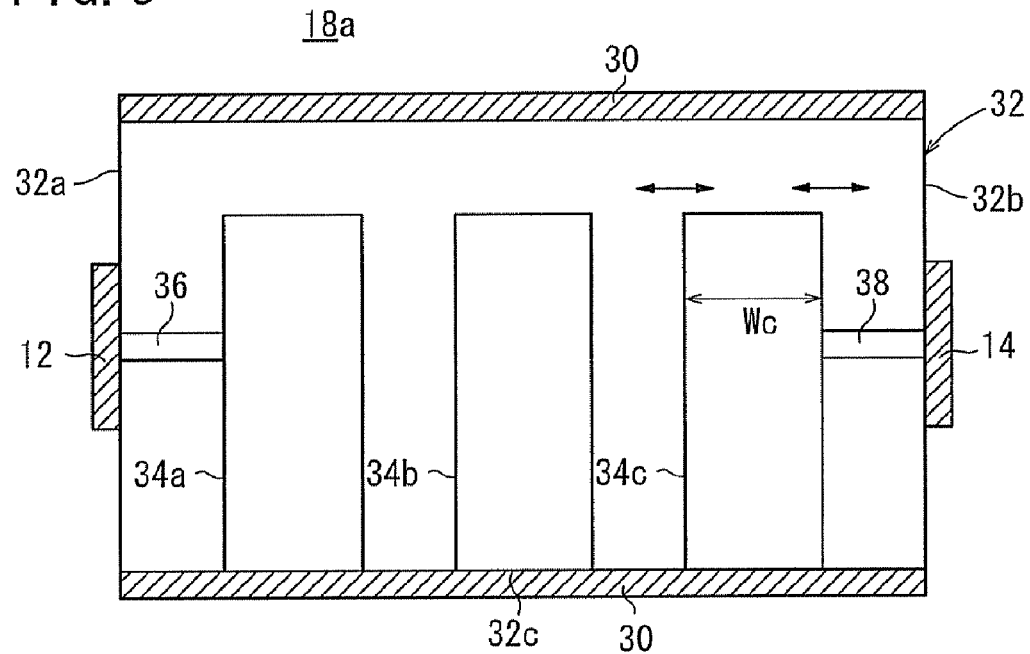
FIG. 5 is a horizontal cross-sectional view of resonator electrodes of a filter according to a first modification of the module according to the first embodiment.

Although the line length Lc of the third resonator electrode 34c is varied in the above embodiment, the width Wc of the third resonator electrode 34c is varied in a filter 18a according to a first modification shown in FIG. 5. The first modification also makes it possible to adjust impedance in the same manner as if the capacitor 26 were connected thereto, although the capacitor 26 is not actually connected to the impedance matching circuit 20.

Figure 6:
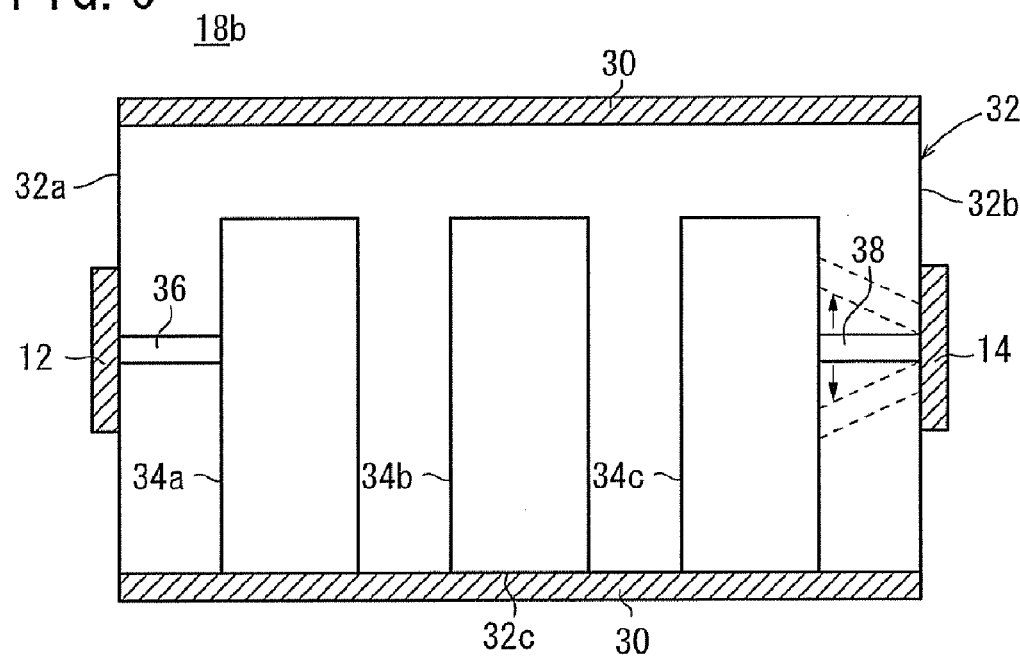
FIG. 6 is a horizontal cross-sectional view of resonator electrodes of a filter according to a second modification of the module according to the first embodiment.

In a filter 18b according to a second modification, as shown in FIG. 6, the position where the third resonator electrode 34c and the second lead electrode 38 are connected to each other is changed in order to vary the series resistance between the third resonator electrode 34c and the output terminal 14. The second modification also makes it possible to adjust impedance in the same manner as if the capacitor 26 were connected thereto, although the capacitor 26 is not actually connected to the impedance matching circuit 20.

A module 10B according to a second embodiment will be described below. Prior to the description of the module 10B according to the second embodiment, the circuit arrangement of a module (a module 100B according to a second comparative example), which is fabricated before the module 10B according to the second embodiment is completed, will be described below.

Figure 7:
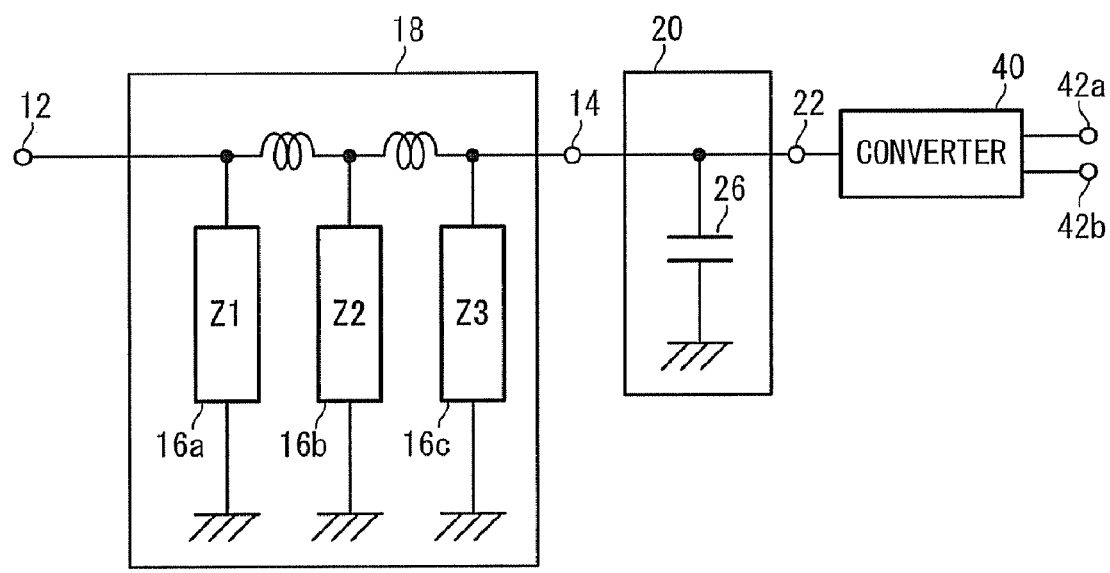
FIG. 7 is a circuit diagram of a module according to a second comparative example of the present invention.

As shown in FIG. 7, as with the module 100A according to the first comparative example, the module 100B according to the second comparative example comprises a filter 18 and an impedance matching circuit 20 electrically connected to the output terminal 14 of the filter. The module 100B according to the second comparative example also includes an unbalanced-to-balanced converter (referred to simply as a "converter") 40 connected to the external terminal 22 of the impedance matching circuit 20. A first balanced output terminal 42a and a second balanced output terminal 42b, which are connected to an external circuit (not shown), extend from the converter 40.

The impedance matching circuit 20 comprises, for example, a capacitor 26 connected between the output terminal 14 of the filter 18 and GND (ground). In the module 100B according to the second comparative example, the output impedance of the converter 40 of the module 100B and the input impedance of the external circuit are adjusted to a given value (e.g., 50 ohms) by the susceptive component of the capacitor 26 of the impedance matching circuit 20.

Figure 8:
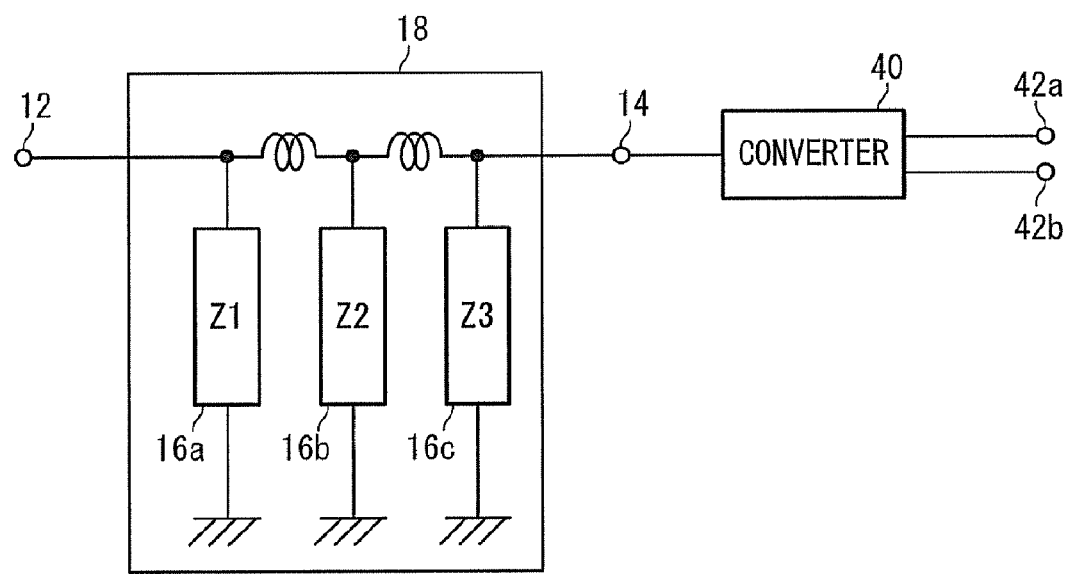
FIG. 8 is a circuit diagram of a module according to a second embodiment of the present invention.

As shown in FIG. 8, the module 10B according to the second embodiment has substantially the same configuration as that of the above module 100B according to the second comparative example. However, among the three resonators 16a through 16c of the filter 18, the third resonator 16c connected to the output terminal 14 has an impedance component Z3, which adjusts the input impedance of the converter 40.

As with the embodiment shown in FIG. 3, only the line length Lc of the third resonator electrode 34c is suitably varied, thereby making it possible to adjust the impedance in the same manner as if the capacitor 26 (see FIG. 7) were connected thereto, although the capacitor 26 is not actually connected to the impedance matching circuit 20 as shown in FIG. 8. Alternatively, as with the modification shown in FIG. 5, the width Wc of the third resonator electrode 34c may be varied, thereby making it possible to adjust the impedance in the same manner as if the capacitor 26 were connected thereto, although the capacitor 26 is not actually connected. Further, alternatively, as with the modification shown in FIG. 6, the position where the third resonator electrode 34c and the second lead electrode 38 are connected to each other may be changed, thereby making it possible to adjust the impedance in the same manner as if the capacitor 26 were connected thereto, although the capacitor 26 is not actually connected.

With the module 10B according to the second embodiment, as described above, since the input impedance of the converter 40 is adjusted by the impedance component Z3 of the third resonator 16c, the impedance matching circuit 20 does not need to be inserted and connected between the filter and the converter 40, or between the converter 40 and the external circuit, and hence the overall module 10B is made up of a reduced number of parts, is small in size, and occupies a reduced mounting area.

A passive part 50A according to the first embodiment will be described below. Prior to the description of the passive part 50A according to the first embodiment, a passive part (a passive part 150A according to a first comparative example), which is fabricated before the passive part 50A according to the first embodiment is completed, will be described below.

Figure 9:
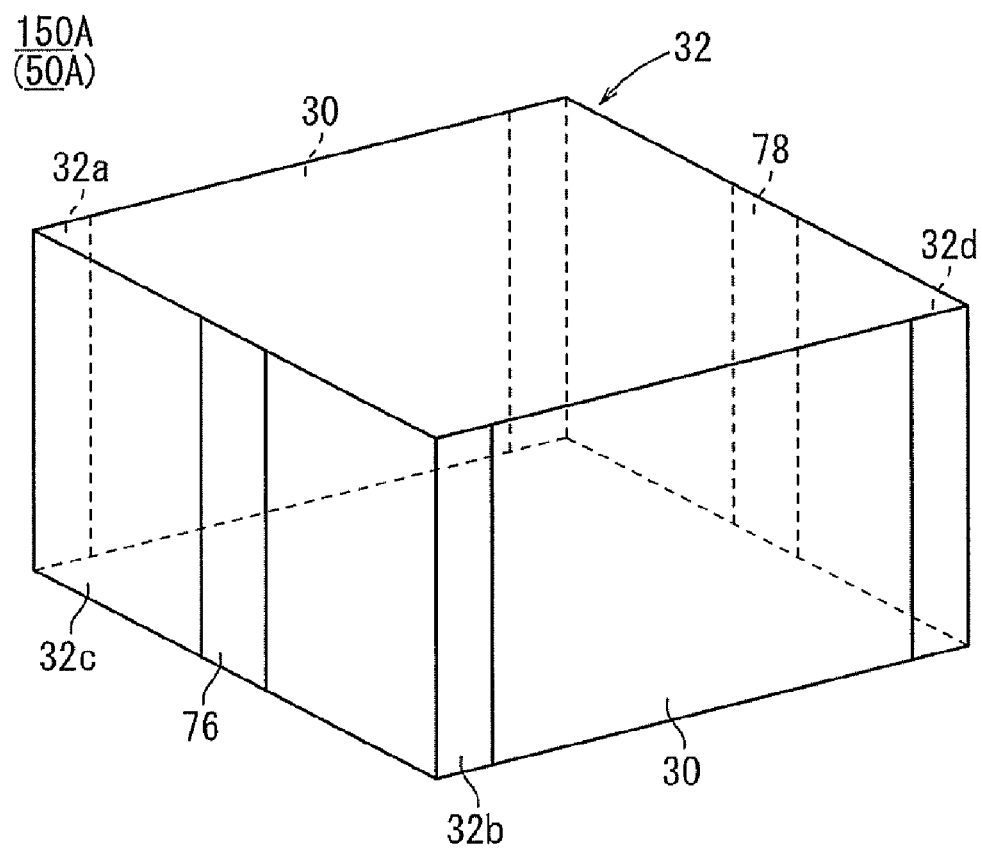
FIG. 9 is a perspective view of a passive part according to the first comparative example and a passive part according to the first embodiment.
Figure 10:
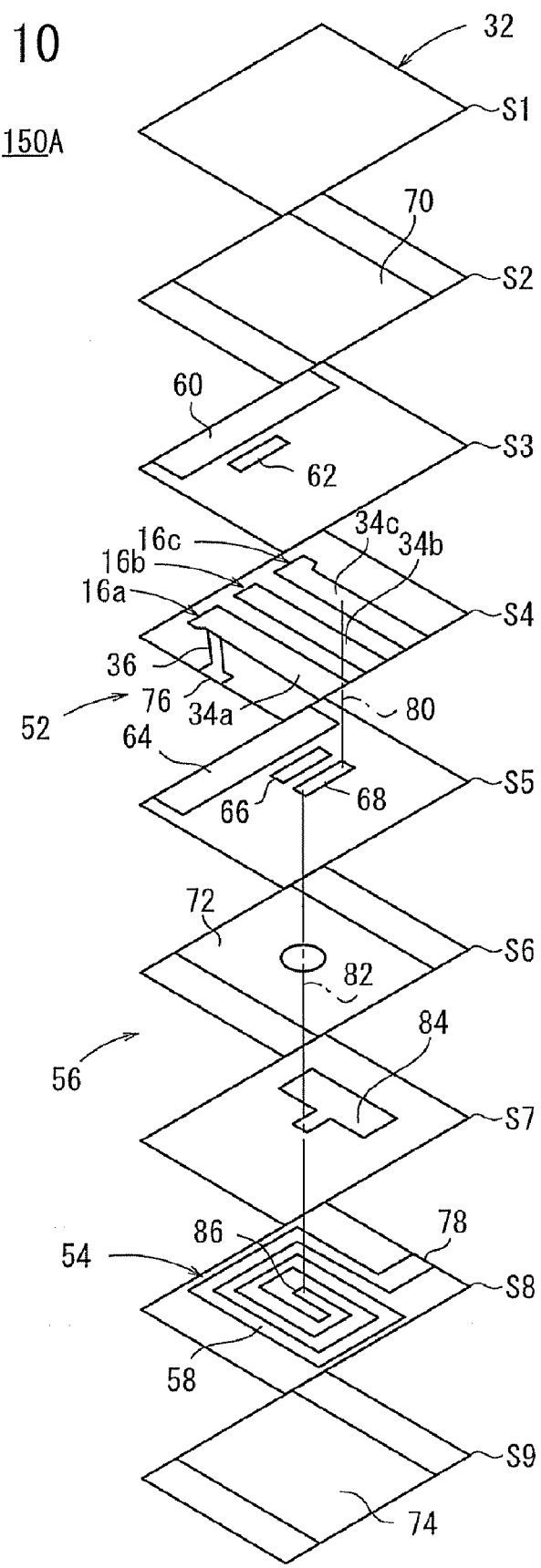
FIG. 10 is an exploded perspective view of the passive part according to the first comparative example.

As shown in FIGS. 9 and 10, the passive part 150A according to the first comparative example includes a dielectric substrate 32 comprising a plurality of dielectric layers (S1 to S9; see FIG. 10), which are stacked and sintered together.

As shown in FIG. 10, the dielectric substrate 32 is constructed by stacking the first through ninth dielectric layers S1 to S9 successively from above. Each of the first through ninth dielectric layers S1 to S9 may comprise a single layer or a plurality of layers.

The dielectric substrate 32 includes a filter 52, an impedance matching circuit 54, and a connector 56 connecting the filter 52 and the impedance matching circuit 54 to each other.

The filter 52 has three ¼-wavelength resonators (first through third resonators 16a through 16c). The impedance matching circuit 54 has a stripline electrode 58 disposed on a principal surface of the eighth dielectric layer S8.

The first resonator 16a of the filter 52 comprises the first resonator electrode 34a, which is disposed on a principal surface of the fourth dielectric layer S4. The second resonator 16b comprises the second resonator electrode 34b, which is disposed on the principal surface of the fourth dielectric layer S4. The third resonator 16c comprises the third resonator electrode 34c, which is disposed on the principal surface of the fourth dielectric layer S4.

A principal surface of the third dielectric layer S3 supports thereon an innerlayer ground electrode 60 facing respective open ends of the first through third resonator electrodes 34a through 34c, and a first coupling adjustment electrode 62 for adjusting the degree of coupling between the first resonator 16a and the second resonator 16b.

A principal surface of the fifth dielectric layer S5 supports thereon an innerlayer ground electrode 64 facing the respective open ends of the first through third resonator electrodes 34a through 34c, a second coupling adjustment electrode 66 that adjusts the degree of coupling between the second resonator 16b and the third resonator 16c, and a connector electrode 68 electrically connecting an output stage of the filter 52 and an input stage of the impedance matching circuit 54.

The filter 52 and the impedance matching circuit 54 are disposed in respective regions of the dielectric substrate 32 vertically separated from each other along the stacking direction of the dielectric layers S1 to S9. In FIG. 10, the filter 52 is disposed in an upper region along the stacking direction, and the impedance matching circuit 54 is disposed in a lower region along the stacking direction, with the connector 56 being interposed therebetween.

The passive part 150A includes innerlayer ground electrodes 70, 72, 74 disposed on respective principal surfaces of the second dielectric layer S2, the sixth dielectric layer S6, and the ninth dielectric layer S9. The innerlayer ground electrode 72 comprises an electrode for isolating the filter 52 and the impedance matching circuit 54 from each other.

As shown in FIG. 9, a ground electrode 30 connected to the innerlayer ground electrodes 60, 64, 70, 72, 74 is disposed on the first side surface 32a, which forms one of the outer peripheral surfaces of the dielectric substrate 32.

A ground electrode 30, which is connected to the innerlayer ground electrodes 70, 72, 74 and to respective ends (short-circuiting ends) of the first through third resonator electrodes 34a through 34c, is disposed on the second side surface 32b of the dielectric substrate 32 (opposite to the first side surface 32a).

An unbalanced input terminal 76 is disposed on the third side surface 32c of the dielectric substrate 32. As shown in FIG. 10, the unbalanced input terminal 76 is connected electrically to the first resonator electrode 34a through the first lead electrode 36.

As shown in FIG. 9, an unbalanced output terminal 78 is disposed on a fourth side surface 32d of the dielectric substrate 32 (opposite to the third side surface 32c).

As shown in FIG. 10, the connector electrode 68 on the principal surface of the fifth dielectric layer S5 is connected to the third resonator electrode 34c through a first via hole 80 disposed in the fourth dielectric layer S4, and also to a stripline electrode 58 of the impedance matching circuit 54 through a second via hole 82 disposed in the fifth through seventh dielectric layers S5 through S7.

A capacitor electrode 84 providing a capacitance between the output stage of the filter 52 and GND is disposed on a principal surface of the seventh dielectric layer S7. The capacitor electrode 84 is disposed in a confronting relation to the innerlayer ground electrode 72, on the principal surface of the sixth dielectric layer S6 with the sixth dielectric layer S6 being interposed therebetween. The capacitor electrode 84 is connected electrically to the connector electrode 68 and to the stripline electrode 58 of the impedance matching circuit 54 through the second via hole 82.

The connector electrode 68, the capacitor electrode 84, the first via hole 80, and the second via hole 82 collectively make up the connector 56.

The stripline electrode 58, which is disposed on the principal surface of the eighth dielectric layer S8, has a spiral shape spreading from an end 86 toward a position on the eighth dielectric layer S8, which faces the unbalanced output terminal 78.

Figure 11:
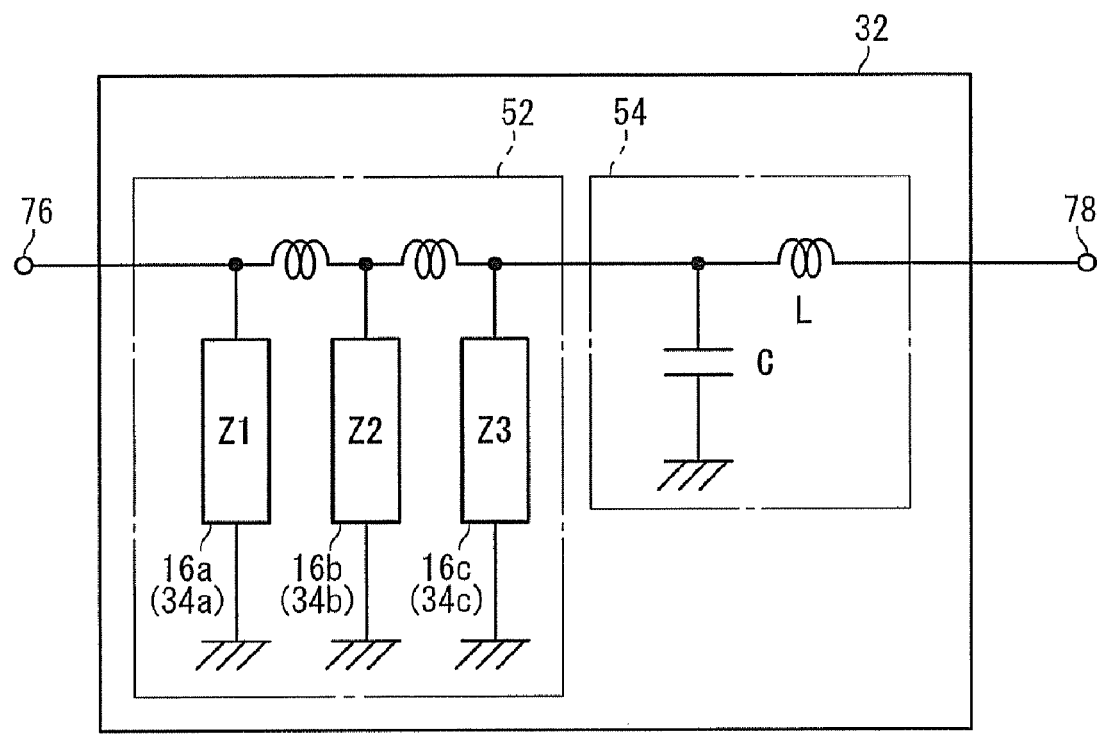
FIG. 11 is a circuit diagram of the passive part according to the first comparative example.

As shown in FIG. 11, the passive part 150A according to the first comparative example thus has a configuration in which the filter 52 and the impedance matching circuit 54 are disposed within the single dielectric substrate 32, and the filter 52 and the impedance matching circuit 54 are connected in series with each other between the input terminal 76 and the output terminal 78.

The impedance matching circuit 54 includes a reactive component (an X component in an impedance $Z=R+jX$, representing an inductance L) provided by the stripline electrode 58 connected between the output stage (the third resonator electrode 34c) of the filter 52 and the output terminal 78, and a susceptive component (a B component in an admittance $Y=1/Z=G+jB$, representing a capacitance C) provided by the capacitor electrode connected between the output stage of the filter 52 and GND.

Figure 12:
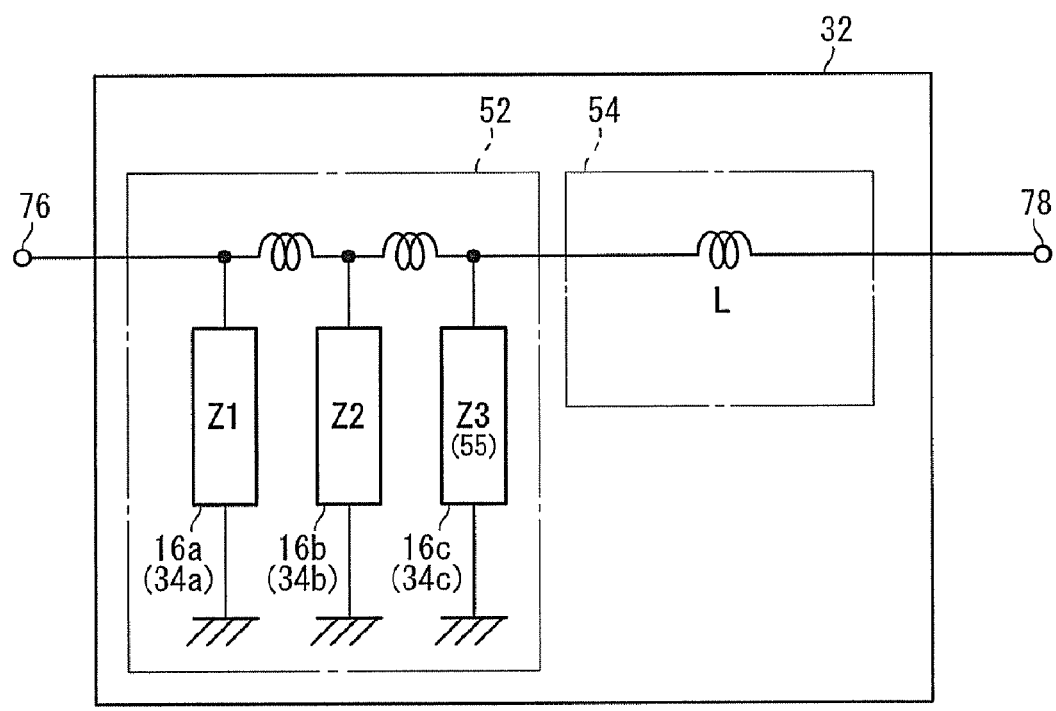
FIG. 12 is a circuit diagram of the passive part according to the first embodiment.

As shown in FIG. 12, the passive part 50A according to the first embodiment has substantially the same configuration as that of the passive part 150A according to the first comparative example. However, among the three resonator electrodes 34a through 34c of the filter 52, the third resonator electrode 34c, which is electrically connected to the impedance matching circuit 54, forms an impedance component Z3, which turns the overall passive part 50A into a configuration including a circuit corresponding to characteristics that include the impedance matching circuit 55. In FIG. 12, the impedance component Z3 of the third resonator electrode 34c turns the passive part 50A into a configuration including a circuit corresponding to characteristics that include a circuit (the second impedance matching circuit 55) corresponding to the capacitance C of the impedance matching circuit 54 shown in FIG. 11.

Figure 13:
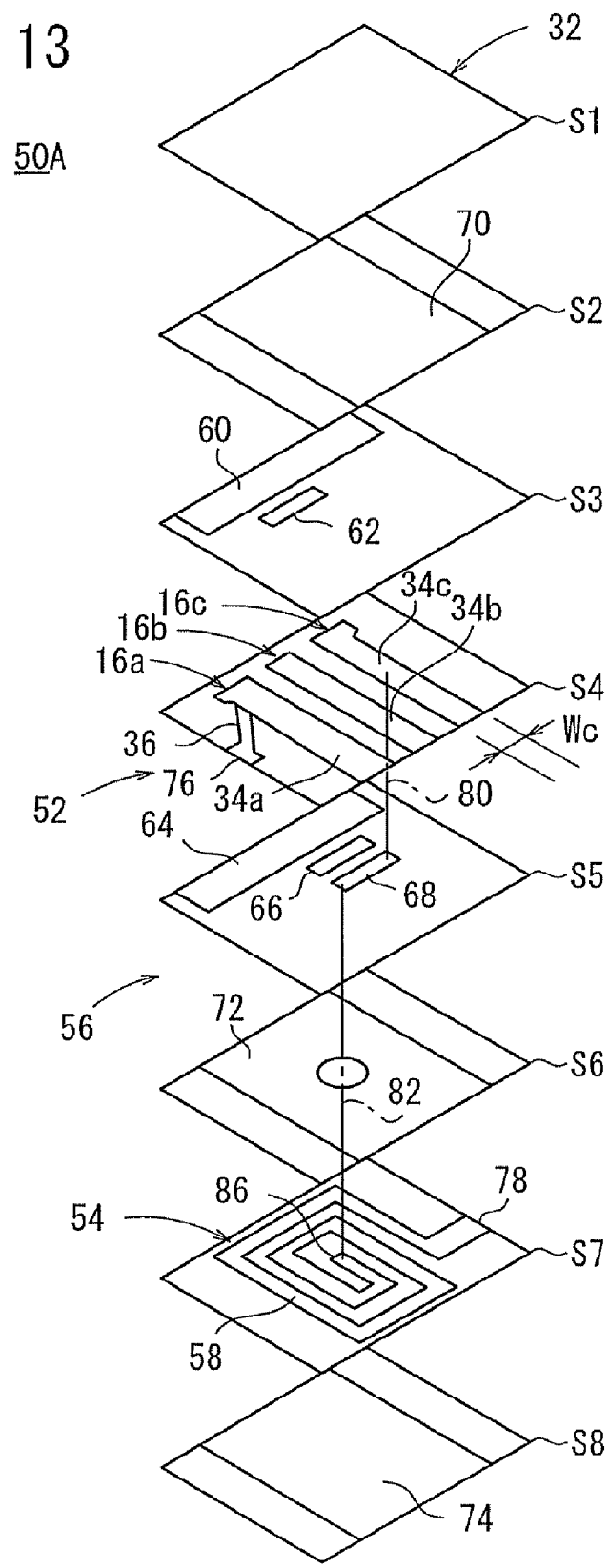
FIG. 13 is an exploded perspective view of the passive part according to the first embodiment.

As shown in FIG. 13, the passive part 50A according to the first embodiment is capable of adjusting the impedance in the same manner as if the capacitance C were connected thereto, even though the capacitance C of the impedance matching circuit 54 is not actually connected, by varying the width Wc of the third resonator electrode 34c.

Consequently, the capacitor electrode 84 (see FIG. 10) disposed on the principal surface of the seventh dielectric layer S7 of the passive part 150A according to the first comparative example can be omitted. In other words, as shown in FIG. 12, the impedance matching circuit 54 comprises only the reactance L provided by the stripline electrode 58.

With the passive part 50A according to the first embodiment, since the impedance component Z3 of the third resonator 16c on the dielectric substrate 32 turns the overall passive part 50A into a configuration including a circuit corresponding to characteristics that include the second impedance matching circuit 55 (corresponding to the capacitance C shown in FIG. 11), the capacitor electrode 84 making up the portion of the impedance matching circuit 54 can be omitted, and hence the number of electrodes disposed in the dielectric substrate 32 can be reduced, thereby allowing the passive part 50A itself to be reduced in size.

In addition to varying the width Wc of the third resonator electrode 34c, the line length of the third resonator electrode 34c may be varied. Further, the position where the third resonator electrode 34c and the first via hole 80 are connected to each other may be changed.

A passive part 50B according to the second embodiment will be described below. Prior to describing the passive part 50B according to the second embodiment, a passive part (a passive part 150B according to the second comparative example), which is fabricated before the passive part 50B according to the second embodiment is completed, will be described below.

Figure 14:
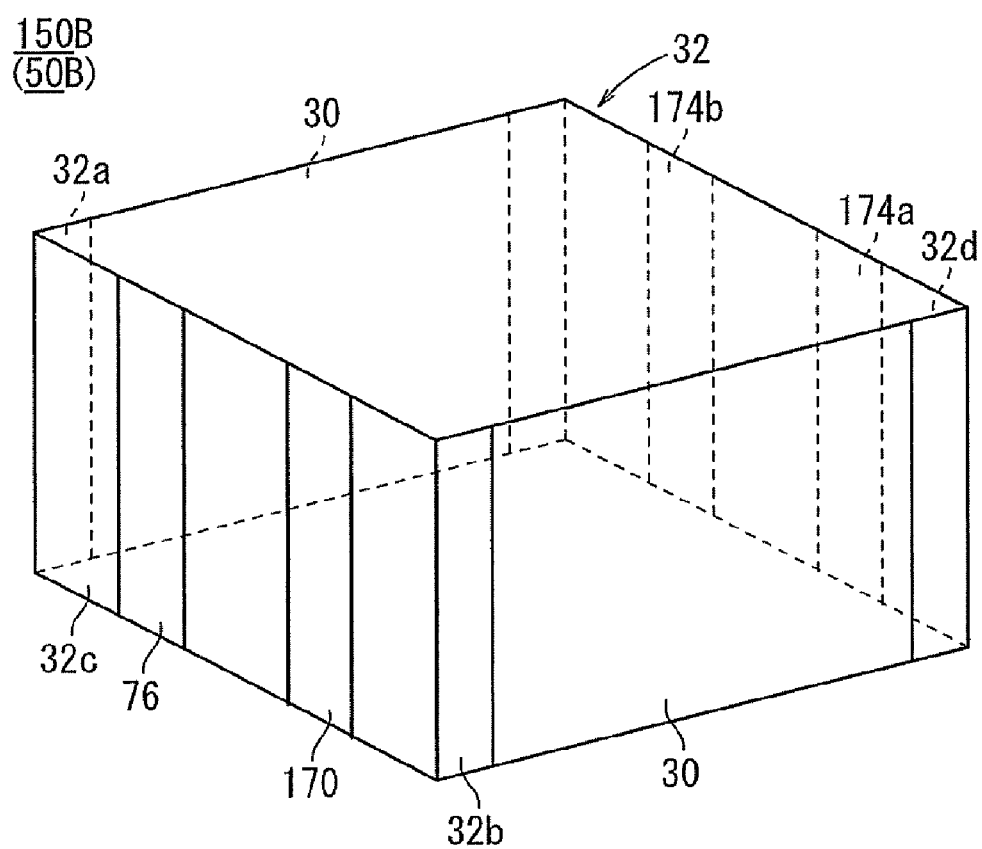
FIG. 14 is a perspective view of a passive part according to the second comparative example and a passive part according to the second embodiment.
Figure 15:
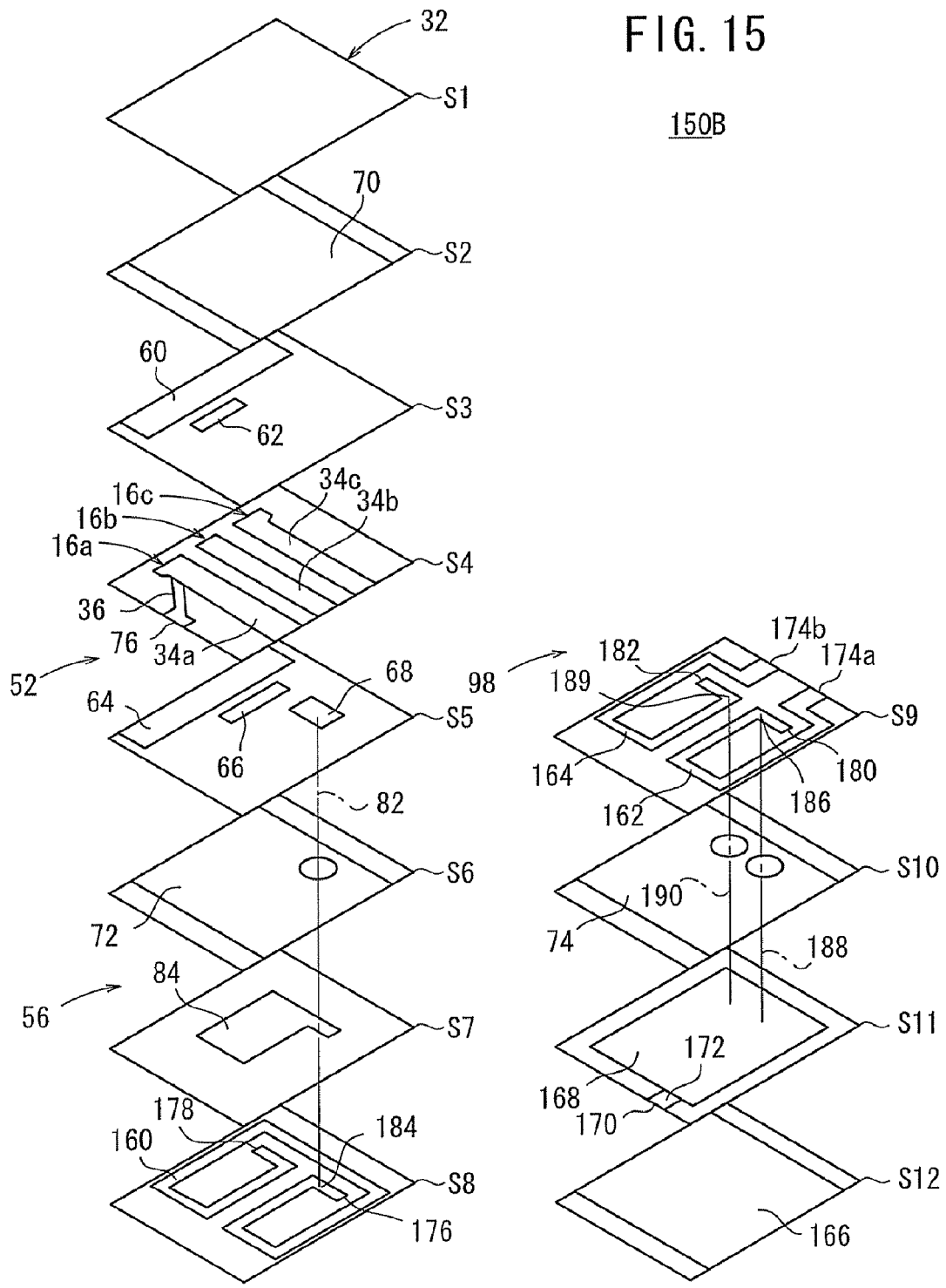
FIG. 15 is an exploded perspective view of the passive part according to the second comparative example.

As shown in FIGS. 14 and 15, the passive part 150B according to the second comparative example includes a dielectric substrate 32 comprising a plurality of dielectric layers (S1 to S12; see FIG. 15), which are stacked and sintered together.

As shown in FIG. 15, the dielectric substrate 32 is constructed by stacking the first through twelfth dielectric layers S1 to S12 successively from above. Each of the first through twelfth dielectric layers S1 to S12 may comprise a single layer or a plurality of layers.

The dielectric substrate 32 includes a filter 52, a converter 98, and a connector 56 connecting the filter 52 and the converter 98 to each other.

The filter 52 comprises three ¼-wavelength resonators (the first through third resonators 16a through 16c), in the same manner as the passive part 150A according to the first comparative example described above. Therefore, the filter 52 will not be described in detail below.

The converter 98 includes a first stripline electrode 160 disposed on a principal surface of the eighth dielectric layer S8, a second stripline electrode 162 disposed on a principal surface of the ninth dielectric layer S9, and a third stripline electrode 164 disposed on the principal surface of the ninth dielectric layer S9.

The filter 52 and the converter 98 are disposed in respective regions of the dielectric substrate 32, which are vertically separated from each other along a direction in which the dielectric layers S1 to S12 are stacked. As shown in FIG. 15, the filter 52 is disposed in an upper region along the stacking direction, whereas the converter 98 is disposed in a lower region along the stacking direction, with the connector 56 being interposed therebetween.

The passive part 150B includes innerlayer ground electrodes 70, 72, 74, 166 disposed on respective principal surfaces of the second dielectric layer S2, the sixth dielectric layer S6, the tenth dielectric layer S10, and the twelfth dielectric layer S12, respectively, and a DC electrode 168 disposed on a principal surface of the eleventh dielectric layer S11. The innerlayer ground electrode 72 comprises an electrode for isolating the filter 52 and the converter 98 from each other.

As shown in FIG. 14, a ground electrode 30 connected to the innerlayer ground electrodes 60, 64, 70, 72, 74, 166 is disposed on the first side surface 32a, which forms one of the outer peripheral surfaces of the dielectric substrate 32.

A ground electrode 30, which is connected to the innerlayer ground electrodes 70, 72, 74, 166 and to respective ends (short-circuiting ends) of the first through third resonator electrodes 34a through 34c, is disposed on the second side surface 32b of the dielectric substrate 32 (opposite to the first side surface 32a).

An unbalanced input terminal 76 and a DC terminal 170 are disposed on the third side surface 32c of the dielectric substrate 32. As shown in FIG. 15, the unbalanced input terminal 76 is connected electrically to the first resonator electrode 34a through the first lead electrode 36. The DC terminal 170 comprises a terminal to which a DC voltage is applied from an external power supply (not shown). The DC terminal 170 is connected electrically to the DC electrode 168 through a third lead electrode 172.

As shown in FIG. 14, a first balanced output terminal 174a and a second balanced output terminal 174b are disposed respectively on a fourth side surface 32d of the dielectric substrate 32 (opposite to the third side surface 32c).

As shown in FIG. 15, a connector electrode 68 is disposed on the principal surface of the fifth dielectric layer S5, in overlapping relation to the third resonator electrode 34c, with the fourth dielectric layer S4 interposed therebetween. The connector electrode 68 is connected electrically to a first stripline electrode 160 of the converter 98 through the second via hole 82 disposed in the fifth through seventh dielectric layers S5 through S7.

A capacitor electrode 84, which forms a capacitance between the output stage of the filter 52 and GND, is disposed on a principal surface of the seventh dielectric layer S7. The capacitor electrode 84 is disposed on a principal surface of the sixth dielectric layer S6 in confronting relation to the innerlayer ground electrode 72, with the sixth dielectric layer S6 being interposed therebetween. The capacitor electrode 84 is connected electrically to the connector electrode 68 and to the first stripline electrode 160 of the converter 98 through the second via hole 82.

The connector electrode 68, the capacitor electrode 84, and the second via hole 82 collectively make up the connector 56.

The first stripline electrode 160 of the converter 98 disposed on the principal surface of the eighth dielectric layer S8 has a spiral shape, spreading from one end 176 and converging toward another end 178, which is positioned in axisymmetric relation to the one end 176.

The second stripline electrode 162 and the third stripline electrode 164 of the converter 98 are disposed on a principal surface of the ninth dielectric layer S9. The second stripline electrode 162 has a spiral shape spreading from an end 180 corresponding to the end 176 of the first stripline electrode 160 toward a position on the ninth dielectric layer S9 facing the first balanced output terminal 174a. The third stripline electrode 164 has a spiral shape spreading from an end 182 corresponding to the other end 178 of the first stripline electrode 160 toward a position on the ninth dielectric layer S9 facing the second balanced output terminal 174b.

The spiral shapes of the second stripline electrode 162 and the third stripline electrode 164 are axisymmetric and have substantially the same physical length.

The first stripline electrode 160 is connected electrically to the capacitor electrode 84 at the end 176, or at a position (connected position 184) near the end 176, by the second via hole 82.

The second stripline electrode 162 is connected electrically to the DC electrode 168 at the end 180, or at a position (connected position 186) near the end 180, by a third via hole 188 disposed in the ninth dielectric layer S9 and the tenth dielectric layer S10. Furthermore, the third stripline electrode 164 is connected electrically to the DC electrode 168 at the end 182 or at a position (connected position 189) near the end 182 by a fourth via hole 190 disposed in the ninth dielectric layer S9 and the tenth dielectric layer S10.

A DC power supply, not shown, is connected through the DC terminal 170 to the second stripline electrode 162 and the third stripline electrode 164. The DC electrode 168 provides a capacitance between the innerlayer ground electrodes 74 and 166 (GND).

Figure 16:
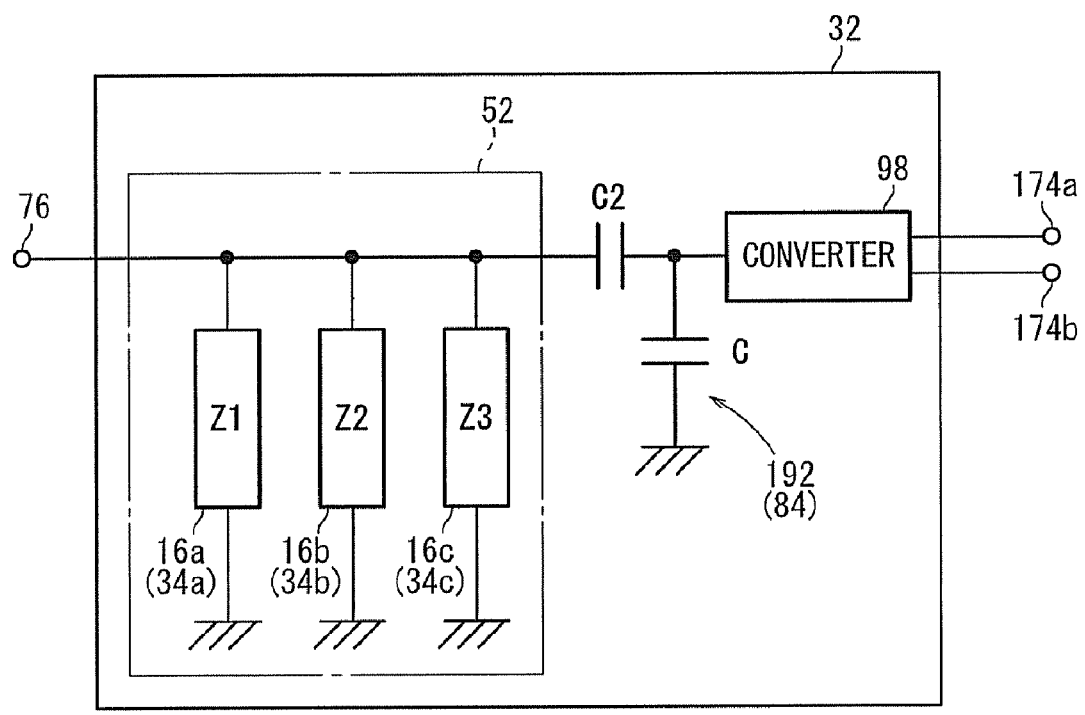
FIG. 16 is a circuit diagram of the passive part according to the second comparative example.

As shown in FIG. 16, the passive part 150B according to the second comparative example has a configuration in which the filter 52 and the converter 98 are disposed within the single dielectric substrate 32. Additionally, the filter 52 and the converter 98 are connected in series with each other by a capacitor C2 between the unbalanced input terminal 76 and the first and second balanced output terminals 174a, 174b. Further, an impedance matching circuit 192 formed by the capacitor electrode 84 is connected between the filter 52 and the converter 98.

The impedance matching circuit 192 includes a susceptive component (capacitance C) provided by the capacitor electrode 84 connected between the output stage (the third resonator electrode 34c) of the filter 52 and GND.

Figure 17:
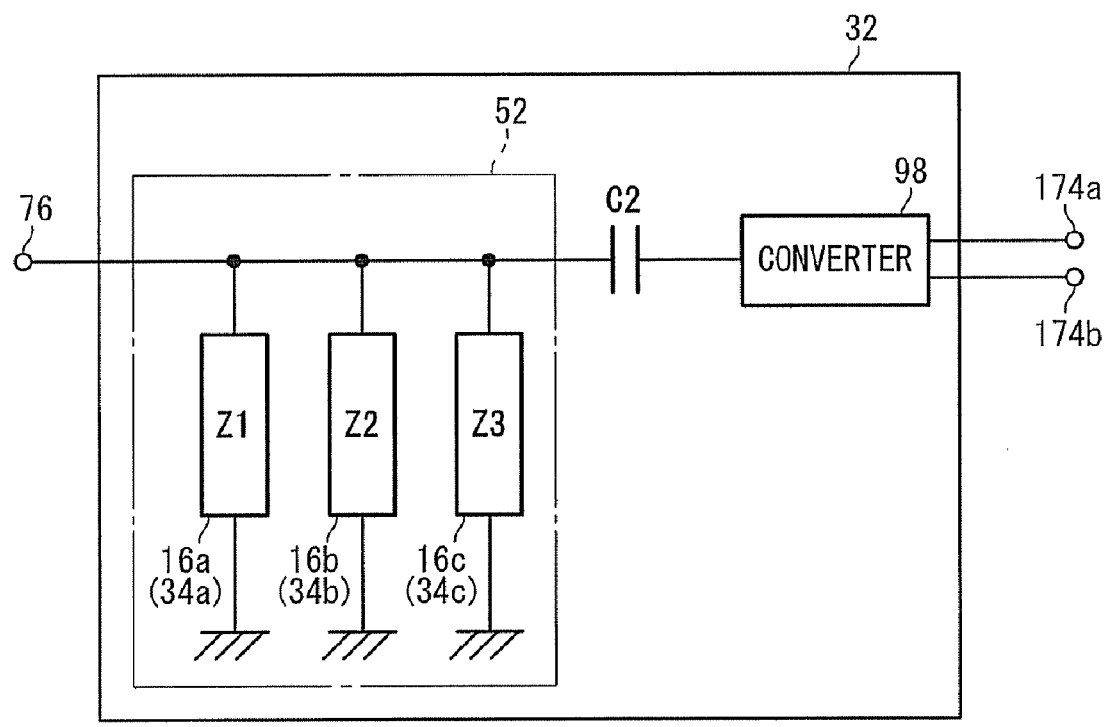
FIG. 17 is a circuit diagram of the passive part according to the second embodiment.

As shown in FIG. 17, the passive part 50B according to the second embodiment has substantially the same configuration as that of the passive part 150B according to the second comparative example. However, among the three resonators (the first through third resonators 16a through 16c) of the filter 52, the third resonator 16c, which is connected electrically to the converter 98 by the capacitor C2, has an impedance component Z3 that adjusts the input impedance of the converter 98.

Figure 18:
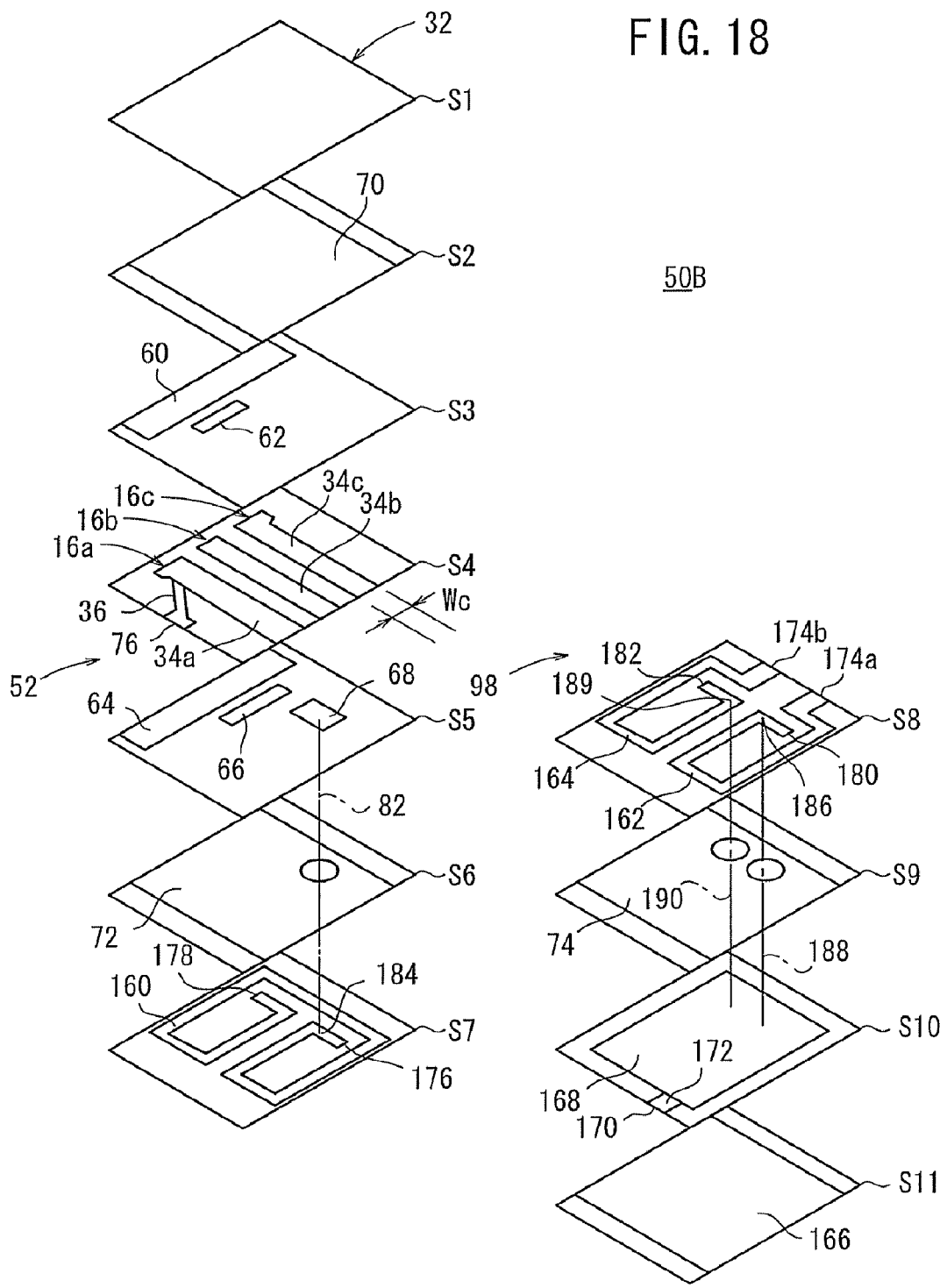
FIG. 18 is an exploded perspective view of the passive part according to the second embodiment.

As shown in FIG. 18, the passive part 50B according to the second embodiment is capable of adjusting the impedance in the same manner as if the capacitance C were connected thereto, although the capacitance C of the impedance matching circuit 192 is not actually connected, by varying the width Wc of the third resonator electrode 34c. Consequently, the capacitor electrode 84 disposed on the principal surface of the seventh dielectric layer S7 of the passive part 150B according to the second comparative example can be omitted.

With the passive part 50B according to the second embodiment, since the output impedance of the converter 98 is adjusted by the impedance component of the third resonator electrode 34c, the capacitor electrode 84 serving as the impedance matching circuit 192 can be omitted, and hence the number of electrodes disposed within the dielectric substrate 32 can be reduced, thus enabling the passive part itself to be reduced in size.

In addition to varying the width Wc of the third resonator electrode 34c, the line length of the third resonator electrode 34c may also be varied.

The module and the passive part according to the present invention are not limited to the above embodiments, but may be of various structures without departing from the gist of the present invention.

The invention claimed is:

1. A passive part comprising a filter having at least a first resonator electrode and a second resonator electrode disposed in a dielectric substrate, and a circuit element having one or more electrodes, said second resonator electrode of said filter and said circuit element being electrically connected to each other,
   wherein said circuit element has an impedance adjusted by an impedance characteristic of said second resonator electrode;
   wherein said second resonator electrode is connected electrically to said circuit element by a tap electrode; and
   wherein said impedance characteristic of said second resonator electrode includes a resistive characteristic adjusted by a position in which said second resonator electrode and said tap electrode are connected to each other.

2. The passive part according to claim 1, wherein said impedance characteristic of said second resonator electrode includes a susceptive characteristic adjusted by a width of said second resonator electrode.

* * * * *